United States Patent
Redmer et al.

[19]

[11] Patent Number: 6,157,026
[45] Date of Patent: Dec. 5, 2000

[54] OPTICAL SWITCH OF THE MULTIPLE PUSH BUTTON TYPE FOR PRODUCING A PLURALITY OF CONTROL SIGNALS

[75] Inventors: Karl Redmer, Hampshire; Robert Brink, Carpentersville, both of Ill.

[73] Assignee: Maxtec International Corporation, Chicago, Ill.

[21] Appl. No.: 09/196,003

[22] Filed: Nov. 19, 1998

[51] Int. Cl.[7] ....................................................... G01D 5/34
[52] U.S. Cl. ........................... 250/229; 340/555; 200/341
[58] Field of Search ................................ 250/229, 237 G; 200/341, 329; 340/555–557; 341/31

[56] References Cited

U.S. PATENT DOCUMENTS

| | | |
|---|---|---|
| 1,886,517 | 11/1932 | Batcheller . |
| 2,385,165 | 9/1945 | Sears . |
| 2,480,410 | 8/1949 | Hammerly . |
| 2,806,907 | 9/1957 | Mazzola . |
| 3,098,141 | 7/1963 | Wintriss . |
| 3,123,724 | 3/1964 | Schrenk et al. . |
| 3,307,006 | 2/1967 | Lawrence . |
| 3,413,430 | 11/1968 | Sharples . |
| 3,465,099 | 9/1969 | Harris . |
| 3,668,407 | 6/1972 | Matzen et al. . |
| 3,946,225 | 3/1976 | Beeck . |
| 4,079,220 | 3/1978 | Wagner et al. . |
| 4,154,997 | 5/1979 | Grebner et al. . |
| 4,206,333 | 6/1980 | Savas et al. . |
| 4,379,968 | 4/1983 | Ely et al. . |
| 4,417,824 | 11/1983 | Paterson et al. . |
| 4,429,219 | 1/1984 | Yochum et al. . |
| 4,442,425 | 4/1984 | Eibner . |
| 4,641,026 | 2/1987 | Garcia, Jr. . |
| 4,774,407 | 9/1988 | Erbe . |
| 4,795,900 | 1/1989 | Kokubu . |
| 4,816,671 | 3/1989 | Umemura . |
| 4,855,590 | 8/1989 | Bures et al. . |
| 5,045,647 | 9/1991 | Kato . |
| 5,272,383 | 12/1993 | Umemura et al. . |
| 5,321,311 | 6/1994 | Umemura et al. . |
| 5,345,050 | 9/1994 | Branch et al. . |
| 5,347,123 | 9/1994 | Jackson ................................... 250/229 |

*Primary Examiner*—Stephone B. Allen
*Attorney, Agent, or Firm*—Michael A. Carrillo; Gary R. Jarosik; Mark R. Galis

[57] ABSTRACT

An optical switch of the multiple push button type for producing a plurality of control signals includes a housing and at least two sliders disposed within the housing. The sliders move between an initial position and at least two other positions. A pair of stationary light shields are disposed between said sliders in spaced apart relation, each of the shields having a plurality of apertures. Light emitting means are disposed between the stationary light shields. Separate light responsive means are disposed adjacent to each of the sliders. A pair of moveable light shields, each disposed between one of the stationary light shields and one of the light responsive means, each has a plurality of apertures and each is movable in response to movement of a separate one of the sliders. Circuitry responds to output of the light responsive means to produce the foregoing control signals, such output being dependent upon the position of the sliders.

15 Claims, 5 Drawing Sheets

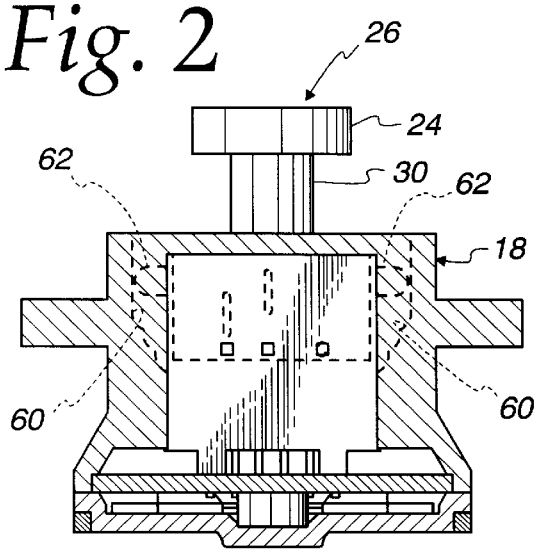
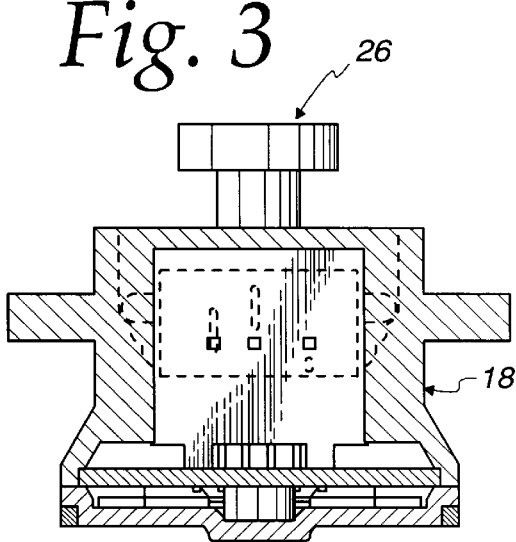
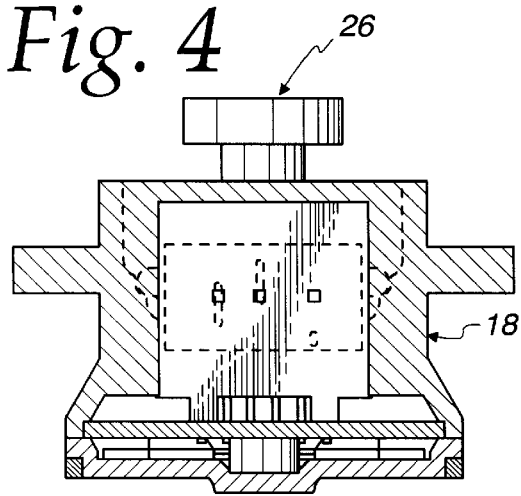
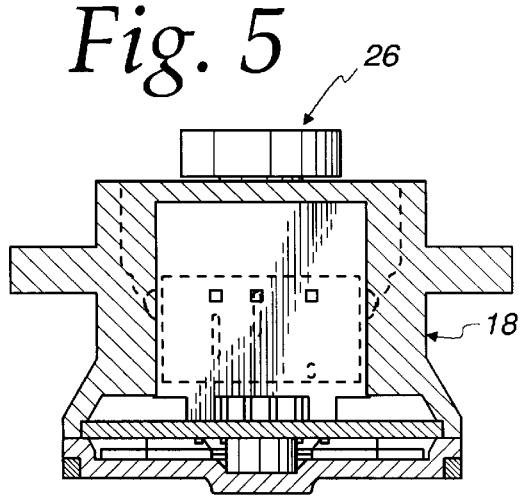

OPTICAL SWITCH OF THE MULTIPLE PUSH BUTTON TYPE FOR PRODUCING A PLURALITY OF CONTROL SIGNALS

The present invention relates generally to switches and, more particularly, to switches for controlling the speed and direction of movement, and other operation of motor driven hoist cranes and the like. More specifically, the invention concerns switches of the multiple push button type wherein each push button may be incrementally manually depressed to each of a plurality of positions in order to thereby produce multiple control signals to variably control an operation such as, for example, the speed of movement of a hoist crane in the vertical direction. In particular, the invention pertains improvements in so-called non-contact optical switches of the above class.

Examples of non-contact optical switches of the foregoing class of switches are disclosed in U.S. Pat. Nos. 5,321,311; 5,272,383; and 4,816,671. Typically, a plurality of these switches are incorporated in a switch panel with each switch comprising a separate module, each module housing a pair of push button mechanisms and associated electronics.

Heretofore, non-contact optical switches, including those disclosed in the above-referenced patents, have been complex structures incorporating numerous parts and involved circuitry. For example, the switches disclosed in the above patents depend on electronics incorporating discrimination capability to prevent erroneous output signals such as would occur, for example, if the operator depressed both push buttons simultaneously.

An object of the present invention is to provide a switch module of the foregoing type having a much simplified, and consequently much less expensive, construction and mode of operation.

SUMMARY OF THE INVENTION

In accordance with one aspect of the invention an optical switch of the multiple push button type for producing a plurality of control signals includes a housing and at least two sliders disposed within the housing. The sliders move between an initial position and at least two other positions. A pair of stationary light shields are disposed between said sliders in spaced apart relation, each of the shields having a plurality of apertures. Light emitting means are disposed between the stationary light shields. Separate light responsive means are disposed adjacent to each of the sliders. A pair of moveable light shields, each disposed between one of the stationary light shields and one of the light responsive means, each has a plurality of apertures and each is movable in response to movement of a separate one of the sliders. Circuitry responds to output of the light responsive means to produce the foregoing control signals, such output being dependent upon the position of the sliders.

In a preferred embodiment the sliders comprise body portions of the push buttons and the light responsive means comprise an array of photo transistors, In accordance with another aspect of the invention an optical switch incorporates a switch module. Two push buttons extend into the interior of the switch module housing from the exterior thereof. Each button has a body portion disposed within the housing for movement through each of a plurality of positions. Stationary light shields are fixedly disposed in spaced apart relation within the housing, each of the shields having a plurality of apertures. First and second light emitting means are fixedly disposed within the housing between the shields, the first of the light emitting means being in optical alignment with the apertures of one of the shields, and the second of the light responsive means being in optical alignment with the apertures of another of the shields. First and second light responsive means are fixedly disposed in spaced apart relation within the housing with the shields and the first and second light emitting means being disposed therebetween, with the first of the light responsive means being in optical alignment with the apertures of one of the shields, and the second of the light responsive means being in optical alignment with the apertures of another of the shields. A first shutter is associated with the body portion of one of the push buttons, and is responsive to movement thereof to open and close predetermined of the apertures of one of the shields. A second shutter is associated with the body portion of the other of the push buttons, and is responsive to movement thereof to open and close predetermined of the apertures of another of the shields.

In a preferred form each of the light responsive means comprise a plurality of photo transistors and each of the light emitting means comprise a plurality of light emitting diodes. The output of the photo transistors determines the overall functionality of the switch.

The features of the present invention are discussed in more detail below, and it is not intended that the summary presented hereinabove should in any way limit the nature or scope of the invention disclosed and claimed herein.

DESCRIPTION OF THE DRAWINGS

The invention if further described with reference to the accompanying drawings, where like numbers refer to like parts in several views.

FIGS. 2 through 5 are sectional views of a switch module taken, as indicated, along the line 2, 3, 4, 5—2, 3, 4, 5, of FIG. 9 with the module being assembled and with one of the push buttons in each of plurality of positions;

These drawing figures are provided for illustrative purposes only and are not drawn to scale, nor should they be construed to limit the intended scope and purpose of the present invention.

DETAILED DESCRIPTION

Figure 1:
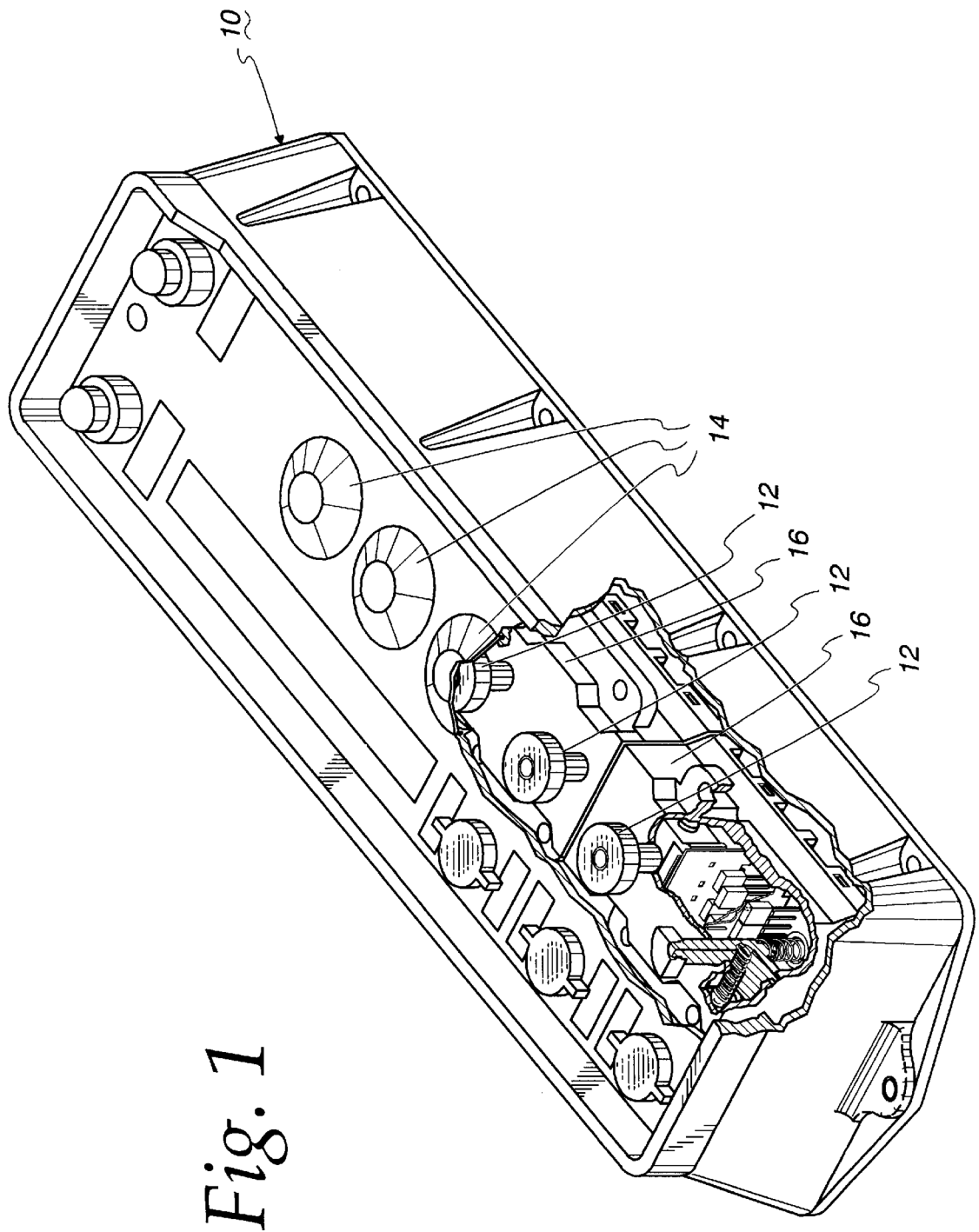
FIG. 1 is a perspective view, partially broken away, of a control panel incorporating non-contact optical switches in accordance with the present invention.

With reference to FIG. 1 there is shown for purposes of illustrative disclosure a typical control panel 10 for controlling the operation of, for example, a hoist crane. Such hoist cranes are driven by control motors for variable speed movement along each of X-Y-Z coordinates. As is typical, control panel 10 is actuated by manually depressing selected push buttons 12, which are covered by flexible covers 14, to various depressed positions. One push button, for example, is provided to control vertical movement in the upward direction. As such push button is depressed through several positions the speed of such upward movement is sequentially increased. Pairs of push buttons 12 are incorporated in each of the non-contact optical switch modules 16 as is conventional. As is well known, it is necessary to prevent conflicting control signals from being generated if both the push buttons of a single module 16 are simultaneously depressed.

Figure 9:
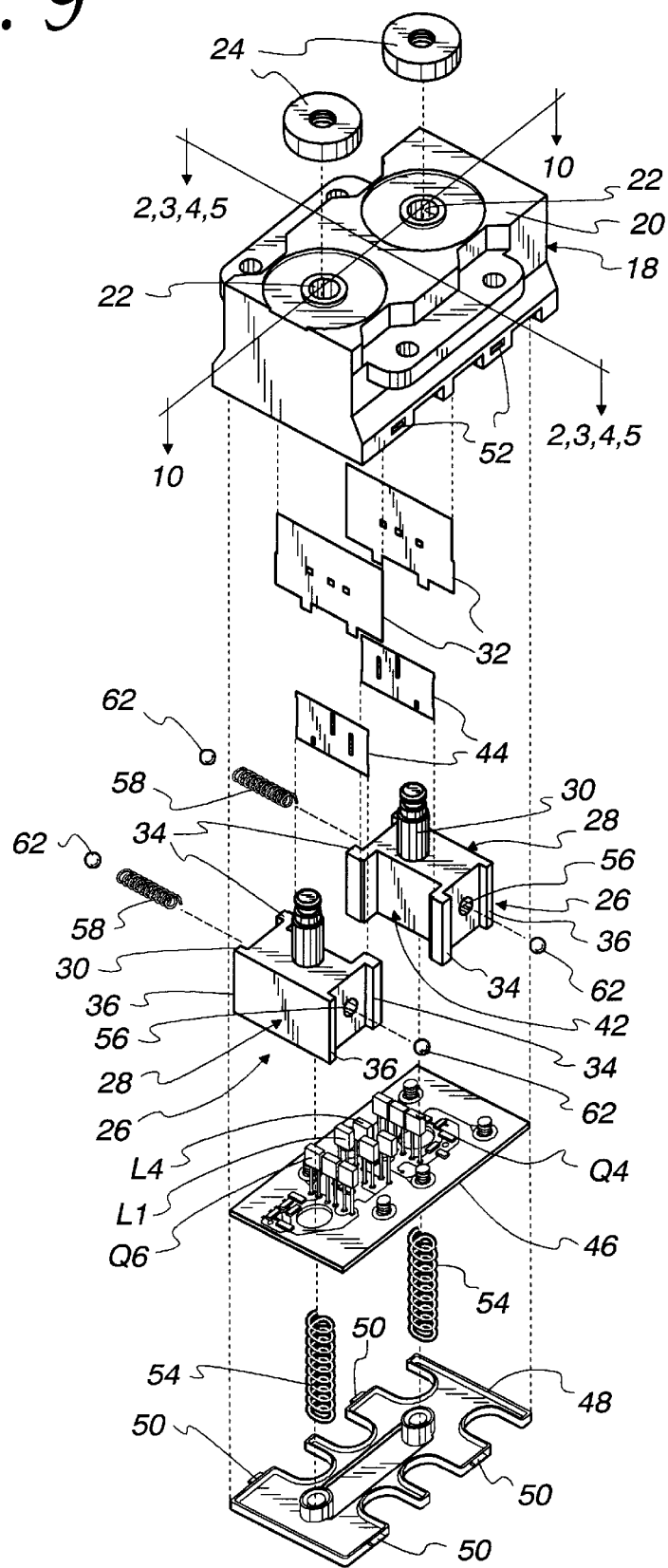
FIG. 9 is an exploded perspective view of a switch in accordance with the invention.
Figure 10:
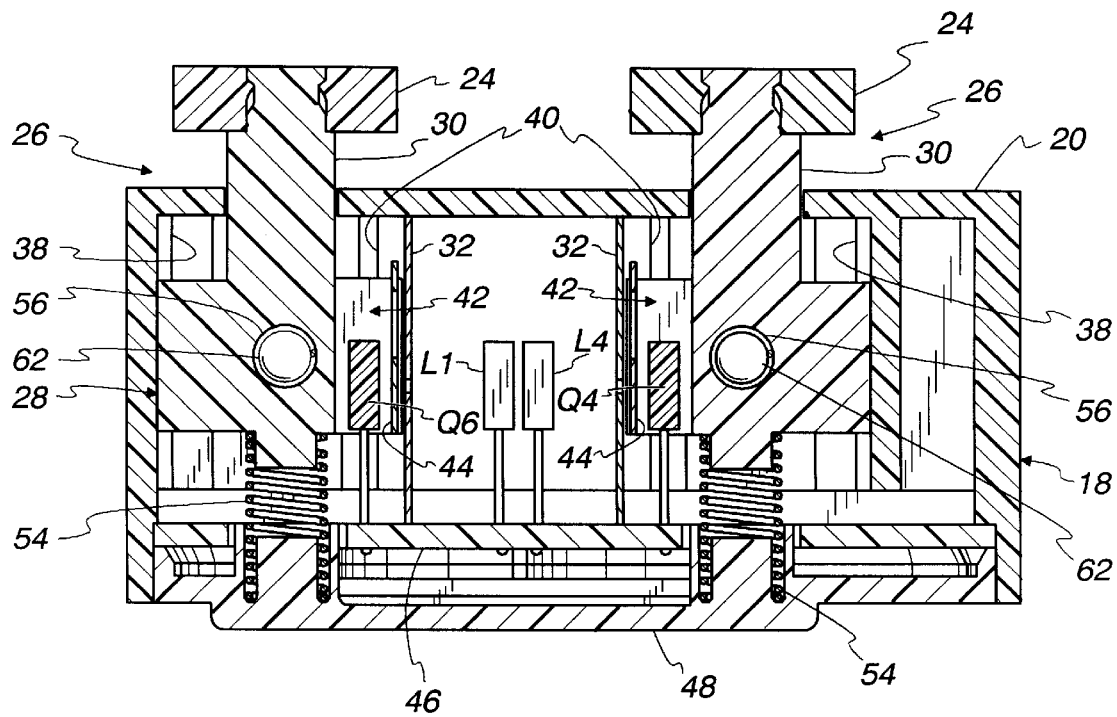
FIG. 10 is a cross sectional view taken, as indicated, along the line 10—10 of FIG. 9 of a switch module in assembled form in accordance with the invention.

With reference to FIGS. 9 and 10 the components of a non-contact optical switch in accordance with the presently preferred embodiment of the invention are shown to comprise a housing 18 having an upper wall 20 that includes a pair of journal openings 22. Two push buttons 26 each has a block-like body portion 28 and an integral shaft position 30. As will be described, each body portion 28 is disposed within housing 18 for reciprocal movement therein along a linear travel path. Each shaft portion 30 extends through one of the journal openings 22 from the interior of the housing 18 to the exterior thereof. Each shaft portion 30 has a free end to which a cap 24 is snap fit.

Each body portion 28 of the push buttons 26 includes a plurality of corner ribs or tongues 34, 36 (see FIG. 9) which are received in guideways 38, 40 (see FIG. 10) in the form of linearly extending grooves provided in each of the opposed interior side walls of the module housing 18 so that each body 28 is reciprocally slidably received therein for travel along a linear travel path.

A pair of stationary light shields 32, each in the form of a thin metallic plate, are disposed in fixed, spaced apart relation within housing 18. The opposed side edge portions 32A (see FIG. 17) of each shield 32 are received in mounting slots provided in the opposed interior side walls of the housing 18 so that each shield 32 completely spans the housing interior from side to side.

Figure 6:
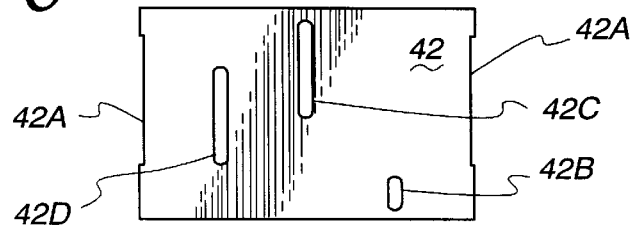
FIG. 6 is an elevational view of a shutter plate.
Figure 7:
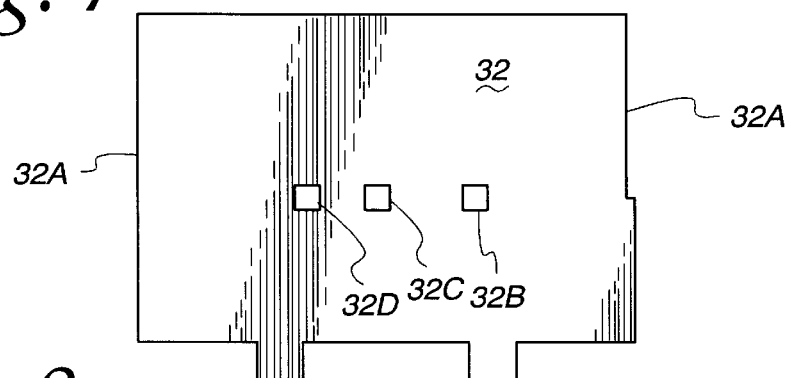
FIG. 7 is an elevational view of a stationary light shield.
Figure 11:
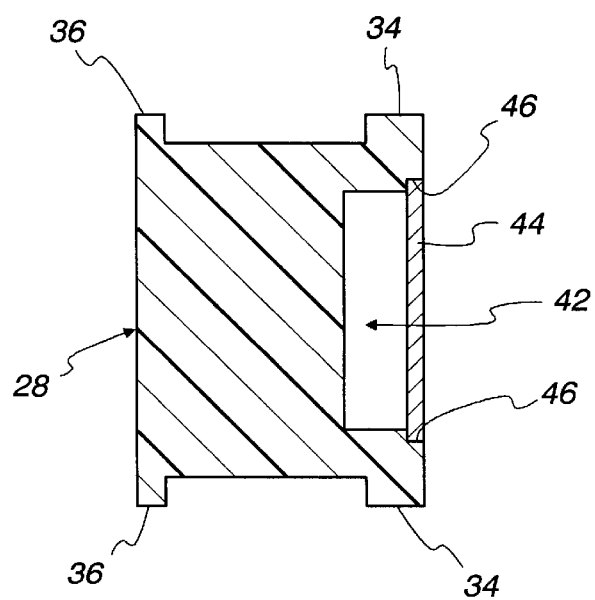
FIG. 11 is an enlarged fragmentary view of the body portion of a push button.

With reference to FIG. 11, each body portion 28 of the push buttons 12 includes a recessed section 42 and carries a shutter 44 in the form of a thin metallic plate. Each shutter 44 has side edges 44A (see FIG. 6) which are snugly fitted into grooves 46 of a body portion 28 so that the recessed section 42 together with its associated shutter form a slot.

Figure 8:
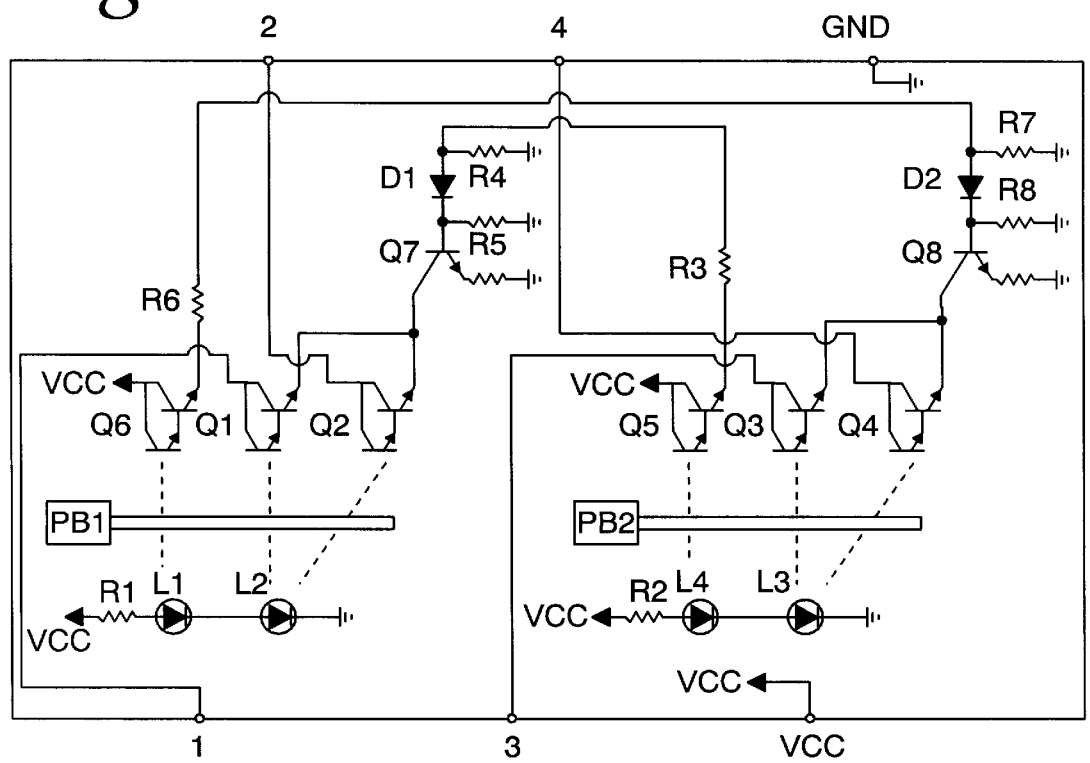
FIG. 8 is a circuit diagram of the electronics incorporated in a switch in accordance with the invention.

The electronic components of FIG. 8 are mounted on a circuit board 46 in conventional fashion. A bottom cover 48 is provided with tabs 50 for snap fit reception in slots 52 of the housing 18.

The two push buttons 26 are biased upwardly by springs 54. A tactile feel is given to the push buttons and a plurality of positive positions is provided for each in a conventional manner. Briefly, each body portion 28 has a central transverse tunnel 56 through which a spring 58 extends. As best shown in FIGS. 2–5, the opposed interior side walls of the housing 18 are provided with stepped grooves 60 for receiving ball bearings 62 which are urged outwardly from the body portion 28 and into grooves 60 by the spring 58. As a push button is depressed by the operator against the force of spring 54, bearings 62 are urged inwardly and downwardly to the next "step."

In the illustrated embodiment there are four push button positions as shown in FIGS. 2–5. In FIG. 2 a push button 26 is shown in its fully extended position. Depression of the push button requires some operator effort to overcome the outward biasing force of spring 58 before the bearings snap down to the next lower step. In FIG. 3 it is shown depressed to a first operative position wherein bearings 62 engage an inwardly disposed segment or step of grooves 60. In FIG. 4 the push button 26 has been depressed to a second operative position. In FIG. 5 the button 26 has been fully depressed to a third operative position.

As best shown in FIGS. 8–10, each switch module 16 incorporates four light emitting diodes L1–L4, two for each push button 26, and six light responsive transistors Q1–Q6, three for each push button 26. The light emitting diodes L1–L4 are located between the shields 32. Three of the light responsive transistors, Q1, Q2 and Q6, are disposed in the recessed section 42 of one of the body portions 28 with the remaining three light responsive transistors are disposed in the recessed section 42 of the other body portion 28 as best shown in FIG. 10.

In FIG. 8 there are four output terminals denoted 1, 2, 3 and 4 which are connected to the emitters of light responsive transistors Q1–Q4, respectively. As will be explained more fully hereinbelow, with the illustrated arrangement, one of the push buttons can cause output signals to be produced at terminal 1 only, at terminals 1 and 2 simultaneously, and at terminal 2 only while the other push button can cause a like combination of output signals at terminals 3 and 4.

Each shield 32 has a plurality of openings 32B, 32C and 32D. Each shutter 42 has a plurality of elongated openings 42B, 42C and 42D. When a push button 26 is in its fully extended position (see FIG. 2) shutter opening 42B is aligned with shield opening 32B. However, shutter openings 42C and 42D are not aligned with shield openings 32C and 32D. When both push buttons of a module 18 are at the position shown in FIG. 2, light from emitting diodes L1 and L4 (see FIG. 8) pass through the shield and shutter to light responsive transistors Q6 and Q5 respectively. However, no light is transmitted to any of transistors Q1, Q2, Q3 or Q4. When either of the two push buttons 26 of module 18 is depressed slightly, shutter opening 42B of its associated shutter 42 becomes optically misaligned with shield opening 32B. Thus, for example, if light responsive transistor Q6 fails to receive light from emitting diode L1 due to misalignment of its associated shutter opening 42B and shield opening 32B (as shown in FIG. 3), light responsive transistors Q3 and Q4 are unable to produce output signals to their respective terminals 3 and 4.

In FIG. 3 the shutter opening 42D has become aligned with shield opening 32D but shutter opening 42C remains misaligned with shield opening 32C. With a depressed push button 26 in this position, and with reference to FIG. 8 assuming such push button is associated with diodes L1 and L2, it will be noted light responsive transistor R1 will produce an output at terminal 1. Further depression of the same push button will result in optical alignment of both shutter openings 42C and 42D with shield openings 32C and 32D as shown in FIG. 4, thereby causing light responsive transistors Q1 and Q2 to produce outputs at both terminals 1 and 2. Still further depression of the same push button results in alignment of only shutter opening 42C with shield opening 32C, thereby causing light responsive transistor Q2 to produce an output at terminal 2.

As will be apparent, if the push button 26 associated with diodes L3 and L4 were to be the first to be depressed, light responsive transistors Q1 and Q2 would be disabled while transistors Q3 and Q4 would cause outputs at terminal 3 only, at terminals 3 and 4, and at terminal 4 only depending on the position of the push button. Thus, depression of one of the two push buttons 26 disables the other. If both are depressed, both are disabled. Depressing none, enables all.

In the specific embodiment illustrated herein the circuit elements shown in FIG. 8 are as follows:

| Circuit Element | Description |
| --- | --- |
| L1 | LED, T1 3/4 |
| L2 | LED, T1 3/4 |

-continued

| Circuit Element | Description |
| --- | --- |
| L3 | LED, T1 3/4 |
| L4 | LED, TI 3/4 |
| Q1 | PHOTO TRANSISTOR |
| Q2 | PHOTO TRANSISTOR |
| Q3 | PHOTO TRANSISTOR |
| Q4 | PHOTO TRANSISTOR |
| Q5 | PHOTO TRANSISTOR |
| Q6 | PHOTO TRANSISTOR |
| Q7 | NPN TRANSISTOR |
| Q8 | NPN TRANSISTOR |
| D1 | DIODE |
| D2 | DIODE |
| R1 | 240 ohms |
| R2 | 240 ohms |
| R3 | 4.7K ohms |
| R4 | 22K ohms |
| R5 | 4.7K ohms |
| R6 | 4.7K ohms |
| R7 | 22K ohms |
| R8 | 4.7K ohms |

Although the present invention has been described with reference to preferred embodiments, workers skilled in the art will recognize that changes may be made in form and detail without departing from the spirit and scope of the invention.

What is claimed is:

1. An optical switch comprising:
   a housing,
   two push buttons each extending into the interior of said housing from the exterior thereof and each having a body portion disposed within said housing for movement through each of a plurality of positions,
   stationary light shields fixedly disposed in spaced apart relation within said housing, each of said shields having a plurality of apertures,
   first and second light emitting means fixedly disposed within said housing between said shields, said first of said light emitting means being in optical alignment with said apertures of one of said shields, said second of said light responsive means being in optical alignment with said apertures of another of said shields,
   first and second light responsive means fixedly disposed in spaced apart relation within said housing with said shields and said first and second light emitting means being disposed therebetween, said first of said light responsive means being in optical alignment with said apertures of said one of said shields, said second of said light responsive means being in optical alignment with said apertures of said another of said shields,
   a first shutter associated with said body portion of one of said push buttons, said first shutter being responsive to movement thereof to open and close predetermined of said apertures of said one of said shields, and
   a second shutter associated with said body portion of the other of said push buttons, said second shutter being responsive to movement thereof to open and close predetermined of said apertures of said another of said shields.

2. An optical switch in accordance with claim 1 wherein the body portions of said push buttons are moveable along separate linear travel paths that extend parallel to one another and define a plane, said shields each residing in a plane disposed orthogonally with respect to said plane of said paths.

3. An optical switch in accordance with claim 1 wherein each of said shields comprise a thin shield plate, and wherein each of said apertures is defined by an opening through said plate.

4. An optical switch in accordance with claim 3 wherein each of said opening has an area of approximately 0.0025 inch.

5. An optical switch in accordance with claim 3 wherein said first shutter and said second shutter each comprises a thin shutter plate having a plurality of openings therethrough, said first shutter plate being disposed in closely adjacent relation to said shield plate comprising said one of said shields and being carried by said body portion of said one of said push buttons, said second shutter plate being disposed in closely adjacent relation to said shield plate comprising said another of said shields and being carried by said body portion of said other of said push buttons.

6. An optical switch in accordance with claim 1 wherein each of said first and second light emitting means includes at least two light emitting elements and wherein said each of said first and second light responsive means includes at least three light responsive elements.

7. An optical switch in accordance with claim 1 wherein said stationary light shields are disposed between said first shutter and said second shutter.

8. An optical switch in accordance with claim 7 wherein said first shutter and said second shutter are disposed between said first and second light responsive means.

9. An optical switch in accordance with claim 1 wherein said first shutter and said second shutter are disposed between said first and second light responsive means.

10. An optical switch in accordance with claim 9 wherein said stationary light shields are disposed between said first shutter and said second shutter.

11. An optical switch in accordance with claim 7 wherein the body portions of said push buttons are moveable along separate linear travel paths that extend parallel to one another and define a plane, said shields each residing in a plane disposed orthogonally with respect to said plane of said paths.

12. An optical switch in accordance with claim 7 wherein each of said shields comprise a thin shield plate, and wherein each of said apertures is defined by an opening through said plate.

13. An optical switch in accordance with claim 7 wherein said first shutter and said second shutter each comprises a thin shutter plate having a plurality of openings therethrough, said first shutter plate being disposed in closely adjacent relation to said shield plate comprising one of said shields and carried by said body portion of said one of said push buttons, said second shutter plate being disposed in closely adjacent relation to said shield plate comprising said another of said shields and carried by said body portion of said other of said push buttons.

14. An optical switch in accordance with claim 13 wherein each of said first and second light emitting means includes at least two light emitting elements and wherein said each of said first and second light responsive means includes at least three light responsive elements.

15. In an optical switch of the multiple push button type for producing a plurality of control signals, the combination comprising
   a housing,
   at least two sliders each disposed within said housing to move between an initial position and at least two other positions,
   a pair of stationary light shields disposed between said sliders in spaced apart relation, each of said shields having a plurality of apertures,
   light emitting means disposed between said stationary light shields, separate light responsive means disposed adjacent to each of said sliders, and a pair of moveable light shields each disposed between one of said stationary light shields and one of said light responsive means, each of said movable light shields having a plurality of apertures and each being movable in response to movement of a separate one of said sliders.

* * * * *